US010208397B2

(12) United States Patent
Ryu et al.

(10) Patent No.: US 10,208,397 B2
(45) Date of Patent: Feb. 19, 2019

(54) APPARATUS FOR DEPOSITING A THIN FILM

(71) Applicant: Samsung Electronics Co., Ltd., Suwon-si, Gyeonggi-do (KR)

(72) Inventors: Seung-Min Ryu, Suwon-si (KR); Sang Min Lee, Yongin-si (KR); Hee Jong Jeong, Hwaseong-si (KR); Chaeho Kim, Seoul (KR); Ji Su Son, Hwaseong-si (KR); Jaebong Lee, Seoul (KR); Juwan Lim, Seoul (KR); Jungwoo Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 137 days.

(21) Appl. No.: 15/204,994

(22) Filed: Jul. 7, 2016

(65) Prior Publication Data
US 2017/0037537 A1 Feb. 9, 2017

(30) Foreign Application Priority Data
Aug. 3, 2015 (KR) .................. 10-2015-0109641

(51) Int. Cl.
| C23C 16/44 | (2006.01) |
| C23C 16/455 | (2006.01) |
| C23C 16/458 | (2006.01) |
| C23C 16/50 | (2006.01) |
| C30B 25/08 | (2006.01) |
| C30B 25/10 | (2006.01) |
| C30B 25/12 | (2006.01) |
| C30B 25/14 | (2006.01) |
| C30B 25/16 | (2006.01) |
| C30B 29/06 | (2006.01) |

(Continued)

(52) U.S. Cl.
CPC .......... *C30B 25/16* (2013.01); *C23C 16/4584* (2013.01); *C23C 16/4585* (2013.01); *C23C 16/481* (2013.01); *C23C 16/52* (2013.01); *C30B 25/105* (2013.01)

(58) Field of Classification Search
None
See application file for complete search history.

(56) References Cited

U.S. PATENT DOCUMENTS 5,179,677 A 1/1993 Anderson et al.
5,710,407 A 1/1998 Moore et al.
(Continued)

FOREIGN PATENT DOCUMENTS

JP 3859226 B2 12/2006
JP 2014514734 A 6/2014
(Continued)

*Primary Examiner* — Parviz Hassanzadeh
*Assistant Examiner* — Tiffany Z Nuckols
(74) *Attorney, Agent, or Firm* — Renaissance IP Law Group LLP

(57) ABSTRACT

An apparatus is provided for depositing a thin film. The apparatus includes a chamber, a susceptor disposed in the chamber and supporting a substrate, a reflection housing disposed outside the chamber, a light source unit disposed in the reflection housing and irradiating light to the susceptor, and a light controlling unit blocking at least a portion of an irradiation path of the light to control an irradiation area of the light on the susceptor. At least a portion of the light controlling unit is disposed in the reflection housing.

13 Claims, 13 Drawing Sheets

(51) Int. Cl.
    *C30B 29/10*    (2006.01)
    *C23C 16/48*    (2006.01)
    *C23C 16/52*    (2006.01)

(56) References Cited

U.S. PATENT DOCUMENTS

| | | |
|---|---|---|
| 6,455,814 B1 | 9/2002 | Samoilov et al. |
| 6,465,761 B2 | 10/2002 | Stevens et al. |
| 8,041,197 B2 | 10/2011 | Kasai et al. |
| 8,114,505 B2 | 2/2012 | Forrest et al. |
| 8,404,048 B2 | 3/2013 | Ewert et al. |
| 8,426,778 B1 | 4/2013 | Bolt |
| 2002/0007797 A1 | 1/2002 | Stevens et al. |
| 2002/0180351 A1 | 12/2002 | McNulty et al. |
| 2005/0098553 A1* | 5/2005 | Devine ............... F27B 17/0025 219/411 |
| 2008/0226272 A1 | 9/2008 | Kasai et al. |
| 2010/0291328 A1 | 11/2010 | Forrest et al. |
| 2012/0052216 A1 | 3/2012 | Hanawa et al. |
| 2012/0231633 A1 | 9/2012 | Ewert et al. |
| 2013/0019803 A1 | 1/2013 | Samir et al. |

FOREIGN PATENT DOCUMENTS

| | | |
|---|---|---|
| KR | 20130093113 A | 8/2013 |
| KR | 20140050682 A | 4/2014 |
| WO | 2013016191 A2 | 1/2013 |

\* cited by examiner

APPARATUS FOR DEPOSITING A THIN FILM

CROSS-REFERENCE TO RELATED APPLICATIONS

This U.S. non-provisional patent application claims priority under 35 U.S.C. § 119 to Korean Patent Application No. 10-2015-0109641, filed on Aug. 3, 2015, in the Korean Intellectual Property Office. The entire contents of Korean Patent Application No. 10-2015-0109641 are hereby incorporated by reference.

TECHNICAL FIELD

The present disclosure relates to an apparatus for depositing a thin film. More particularly, the present disclosure relates to an apparatus for depositing an epitaxial thin film.

BACKGROUND

Generally, a semiconductor device may be manufactured through a plurality of unit processes. The unit processes may include a thin film depositing process, a diffusion process, a thermal treatment process, a photolithography process, a polishing process, an etching process, an ion implantation process, and a cleaning process. The thin film depositing process may form a thin film on a substrate. The thin film may be formed with a single-crystalline structure, a poly-crystalline structure, or an amorphous structure. A lattice-defect density of the single-crystalline thin film may be lower than those of the poly-crystalline thin film and the amorphous thin film.

SUMMARY

Exemplary embodiments of the inventive concepts provide an apparatus for depositing a thin film with a uniform thickness. Embodiments of the inventive concepts may also provide an apparatus for depositing a thin film, which is capable of heating a substrate with a uniform temperature, and which is capable of controlling a temperature according to a position of a substrate.

In one embodiment, an apparatus may include a chamber, a susceptor disposed in the chamber and configured to support a substrate, a reflection housing disposed outside the chamber, a light source unit disposed in the reflection housing and irradiating light to the susceptor, and a light controlling unit blocking at least a portion of an irradiation path of the light to control an irradiation area of the light on the susceptor. At least a portion of the light controlling unit may be disposed in the reflection housing. The light controlling unit may include a blocking part to block a portion of the light, and a base part coupling the blocking part to the reflection housing. The blocking part may include a core portion, and a coating layer surrounding the core portion. The core portion may include a metal material, and the coating layer may be a reflection layer. The blocking part may have a ring shape when viewed from a plan view. The blocking part may have a cross-sectional shape corresponding to a parallelogram with an inner sidewall sloping downward from a top surface to a bottom surface of the blocking part and outer sidewall sloping upward from the bottom surface to the top surface. The blocking part may be coaxial with respect to a central axis of the susceptor or, alternatively, may not be coaxial.

In additional aspects, the blocking part may include a first body and a second body coupled to each other to constitute a ring shape. Each of the first and second bodies may have an arc shape. At least one of a radius of curvature, a central angle, a shape of a cross section, a width of the cross section, a height of the cross section or a tilt angle of the cross section of the first body may be different from that or those of the second body. The blocking part may be tilted with respect to a plane perpendicular to a central axis of the susceptor. The blocking part may have an arc shape. The light controlling unit may further include a supporting part connecting the blocking part to the base part, and a clamp part fixing the supporting part to the base part. A buffer space may be provided between the clamp part and the supporting part.

In another embodiment, an apparatus may include a chamber, a susceptor disposed in the chamber and configured to support a substrate, a light source unit disposed above the substrate and irradiating light toward the susceptor, and a light controlling unit disposed between the light source unit and the susceptor to control an irradiation area of the light on the susceptor. The light controlling unit may include a blocking part with a core portion to block the light, and a coating layer surrounding the core portion. The light controlling unit may be disposed in the chamber. The core portion may include a ceramic material, and a coating layer may include a material having a higher etch resistance than that of the core portion. The blocking part may have an arc shape. The apparatus may further include a gas injection part configured to inject a process gas into the chamber, and a gas exhaust part disposed to be opposite to the gas injection part and configured to exhaust the process gas. The light controlling unit may be adjacent to the gas exhaust part. The apparatus may further include a reflection housing disposed outside the chamber. The light source unit may be disposed in the reflection housing. At least a portion of the light controlling unit may be disposed in the reflection housing. The core portion may include a metal material, and the coating layer may include at least one of gold or silver. The blocking part may include at least one body, and the body may have an arc shape. The body may have a cross-sectional shape corresponding to a parallelogram with an inner sidewall sloping downward from a top surface to a bottom surface of the body and outer sidewall sloping upward from the bottom surface to the top surface.

In an additional embodiment, an apparatus may include a chamber, a susceptor disposed in the chamber and configured to support a substrate, a light source unit disposed above the susceptor and irradiating light to the susceptor, a light controlling unit disposed between the light source unit and the susceptor to control an irradiation area of the light directed to the susceptor. The light controlling unit includes a base part, a blocking part, and a supporting part that connects the base part and the blocking part. The blocking part is sized and positioned to block at least a portion of the light directed to the susceptor. The base part couples the blocking part to the chamber. A supporter may also be provided that supports and rotates the susceptor.

In still another embodiment, an apparatus may include a chamber, a susceptor disposed in the chamber and configured to support a substrate, a light source unit disposed above the susceptor and irradiating light to the susceptor, a light controlling unit disposed above the susceptor in the chamber and blocking at least a portion of the light to control an irradiation area of the light directed to the susceptor, a gas injection part disposed in one sidewall of the chamber to inject a process gas into the chamber, and a gas exhaust part disposed in another sidewall, opposite to the one sidewall, of the chamber to exhaust the process gas. The light controlling unit may be disposed adjacent to the gas exhaust part. The light controlling unit may include a blocking part with a core portion and a coating layer surrounding the core portion. The core portion may include a ceramic material, and the coating layer may include a material having a higher etch resistance than that of the core portion.

BRIEF DESCRIPTION OF THE DRAWINGS

The written disclosure herein describes illustrative embodiments that are non-limiting and non-exhaustive. Reference is made to certain of such illustrative embodiments that are depicted in the figures, as listed below.

Figure 1:
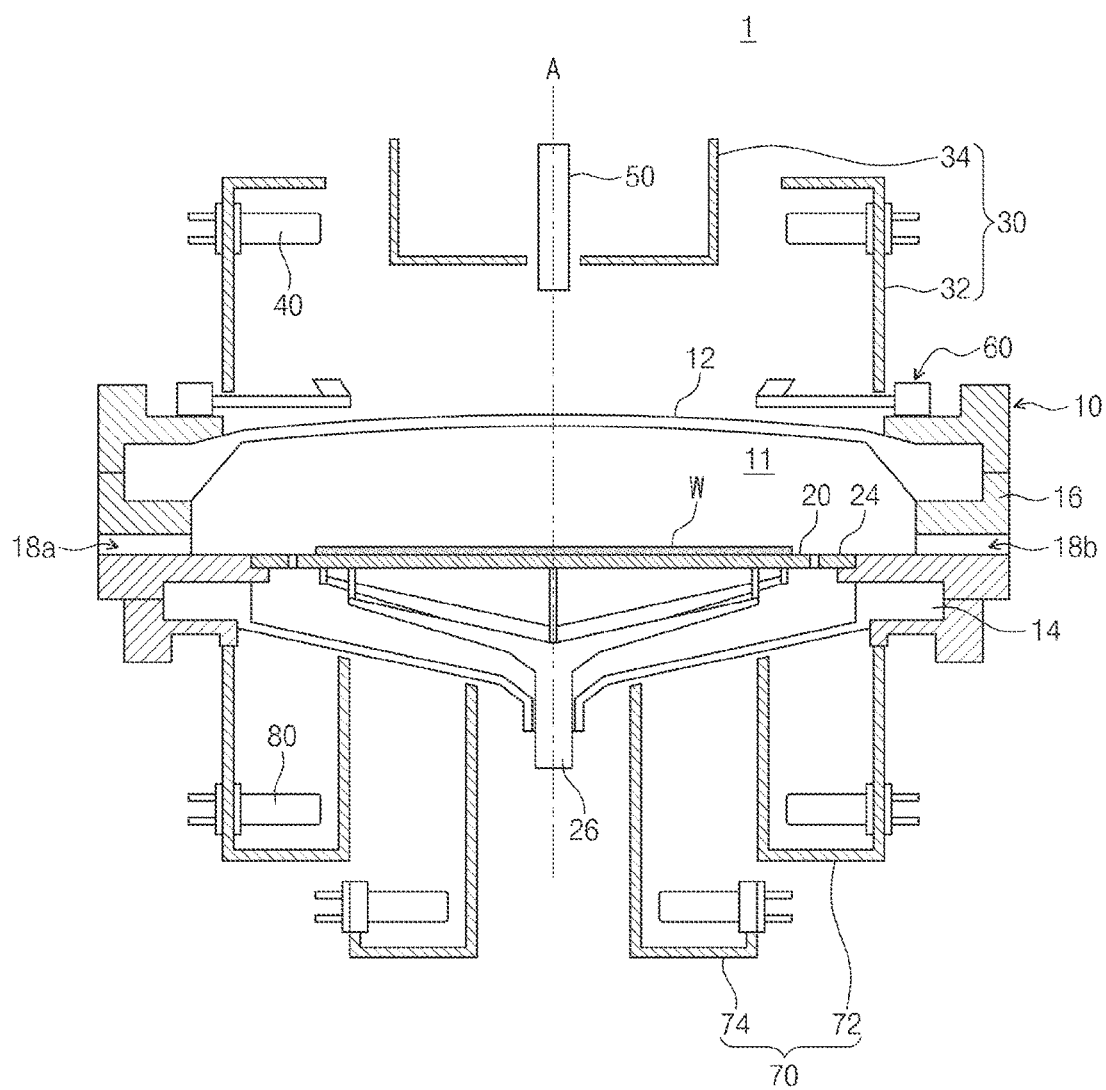
FIG. 1 is a schematic view illustrating an apparatus for depositing a thin film in accordance with an embodiment of the inventive concepts.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of components may be reduced or exaggerated for clarity. The use of similar or identical reference numbers in the various drawings is intended to indicate the presence of a similar or identical element or feature.

DETAILED DESCRIPTION OF THE EMBODIMENTS

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity. The same reference numerals or the same reference designators denote the same elements throughout the specification.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Moreover, exemplary embodiments are described herein with reference to cross-sectional views, perspective views, and/or top or plan views that are idealized exemplary views. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a schematic view illustrating an apparatus 1 for depositing a thin film in accordance with an embodiment of the inventive concepts. Hereinafter, elements of the apparatus 1 for depositing a thin film (herein after referred to as "a thin film deposition apparatus") will be described in detail. The thin film deposition apparatus 1 may include a chamber 10, a susceptor 20, a reflection housing 30, a light source unit 40, a temperature measurement unit 50, and a light controlling unit 60.

Referring to FIG. 1, the chamber 10 may provide an inner space 11 in which a thin film depositing process is performed on a substrate W. The inner space 11 may be controlled to be in a vacuum. The chamber 10 may include an upper chamber 12, a lower chamber 14, and an edge ring 16. The upper chamber 12, the lower chamber 14, and the edge ring 16 may be coupled to each other to define the inner space 11. The upper chamber 12 and the lower chamber 14 may constitute a dome shape, or the lower chamber 14 may have a funnel shape. The upper chamber 12 and the lower chamber 14 may be formed of a transparent material. For example, the upper chamber 12 and the lower chamber 14 may be formed of quartz or glass. The edge ring 16 may surround edges of the upper chamber 12 and the lower chamber 14 and may couple the upper chamber 12 to the lower chamber 14. In an embodiment, the upper chamber 12 and the edge ring 16 may be mechanically coupled to each other by an upper clamp ring.

When a substrate W is loaded into and/or unloaded from the inner space 11, at least one of the upper chamber 12 and the lower chamber 14 may be separated from the edge ring 16. In one embodiment, a substrate W may be loaded and/or unloaded through a slit door (not shown) provided in the edge ring 16. Alternatively, the edge ring 16 may be vertically separated.

The edge ring 16 may have a gas injection part 18$a$ and a gas exhaust part 18$b$. In one embodiment, the edge ring 16 may have holes that connect the inner space 11 of the chamber 10 to the outside of the chamber 10, and the holes of the edge ring 160 may correspond to the gas injection part 18$a$ and the gas exhaust part 18$b$, respectively. The gas injection part 18$a$ may be formed in one side of the edge ring 16, and the gas exhaust part 18$b$ may be formed in another side of the edge ring 16. The gas injection part 18$a$ and the gas exhaust part 18$b$ may be opposite to each other. A process gas may be provided into the chamber 10 through the gas injection part 18$a$. When a process is completed, a process gas may be exhausted to the outside of the chamber 10 through the gas exhaust part 18$b$. The process gas may include silane ($SiH_4$), di-silane ($Si_2H_6$), dichlorosilane ($SiH_2Cl_2$) and/or trichlorosilane ($SiHCl_3$).

The susceptor 20 may be disposed in the inner space 11. The susceptor 20 may support and rotate a substrate W. The susceptor 20 may be formed of any suitable material. Examples of suitable materials include a graphite material or a ceramic material coated with a silicon-based material such as silicon carbide. Other suitable materials that may alternatively be used for the susceptor 20 include another process-resistant material. A preheating ring 24 may surround the susceptor 20. The preheating ring 24 may preheat the process gas to a predetermined temperature. Thus, the process gas may be pyrolyzed such that it is ready for epitaxial growth. A supporter 26 may support the susceptor 20. The supporter 26 may elevate the susceptor 20 and may rotate the susceptor 20 on a central axis A of a substrate W. The central axis A may be an imaginary axis passing through a central point of the substrate W and that is substantially perpendicular to the substrate W. In addition, the central axis A may also pass through a central point of the susceptor 20 and may also be substantially perpendicular to the susceptor 20. Stated otherwise, the central axis A of the substrate W may correspond to the central axis A of the susceptor 20. For example, the supporter 26 and the susceptor 20 may rotate a substrate W at a rotational speed of about 10 rpm to about 100 rpm. Because the susceptor 20 is rotated, an entire area of a substrate W may be uniformly processed.

The reflection housing 30 may be disposed on the chamber 10 and outside the chamber 10. The reflection housing 30 may cover the upper chamber 12. The reflection housing 30 may include a first sub-reflection housing 32 and a second sub-reflection housing 34. The first sub-reflection housing 32 and the second sub-reflection housing 34 may be coupled to each other. The first sub-reflection housing 32 and the second sub-reflection housing 34 may provide a space in which light irradiated from the light source unit 40 is reflected. The reflection housing 30 may reflect the light irradiated from the light source unit 40 such that the light is irradiated to a desired position such as a substrate W, the susceptor 20, or the preheating ring 24. In an embodiment, the reflection housing 30 may concentrate the light irradiated from the light source unit 40 to a substrate W. The inside of the reflection housing 30 may be coated with a material with high reflectivity.

The light source unit 40 may be disposed in the reflection housing 30. Instead of a single light source unit 40, as depicted, a plurality of light source units 40 may also be included. The plurality of light source units 40 may be arranged along a circumferential direction of the reflection housing 30. A halogen lamp is an example of a suitable light source for use as the light source unit 40. Light from light source unit 40 heats substrate W by irradiation. The light irradiated from the light source unit 40 may be absorbed by the substrate W, the susceptor 20, and the preheating ring 24 so as to be converted into thermal energy. The light irradiated from the light source unit 40 may include infrared light. The light irradiated from the light source unit 40 may be transmitted directly through the upper chamber 12 so as to be provided into the inner space 11. In addition, the light irradiated from the light source unit 40 may be reflected in the reflection housing 30 and may be transmitted then through the upper chamber 12 so as to reach into the inner space 11.

The temperature measurement unit 50 may be disposed to face a top surface of the substrate W. The temperature measurement unit 50 may be positioned to correspond to the central axis A of the substrate W. Stated otherwise, the temperature measurement unit 50 may be coaxially aligned with the central axis A of the substrate W. The temperature measurement unit 50 may measure a temperature of a heating area of a substrate W. In one embodiment, the temperature measurement unit 50 may be a pyrometer. A plurality of temperature measurement units 50 may also be included instead of a single temperature measurement unit 50, as depicted.

Figure 2:
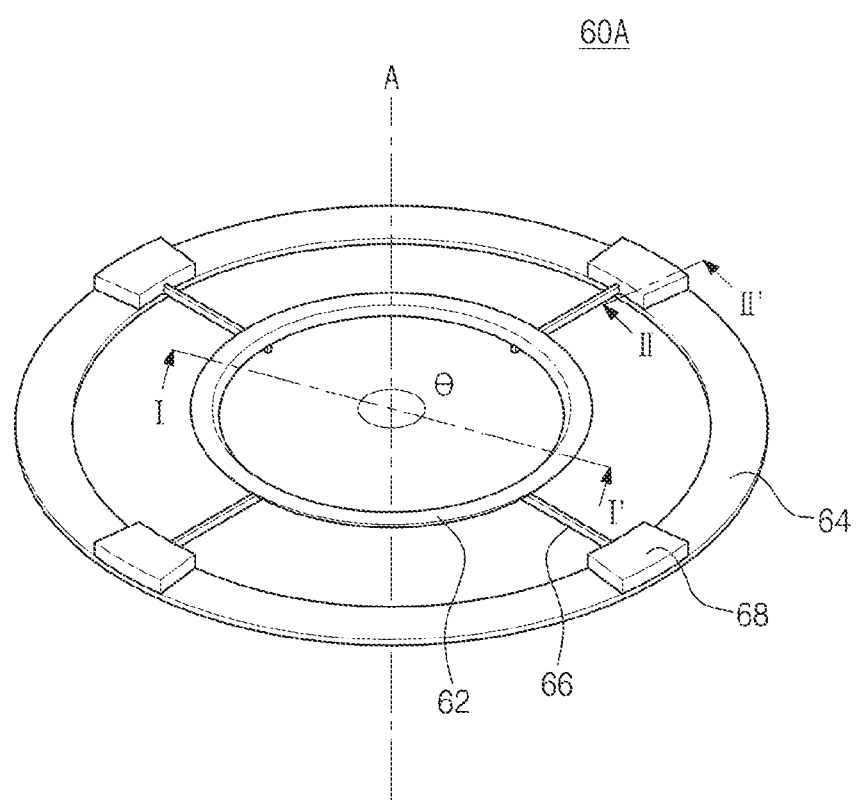
FIG. 2 is a perspective view illustrating a light controlling unit according to an embodiment of the inventive concepts.
Figure 3A:
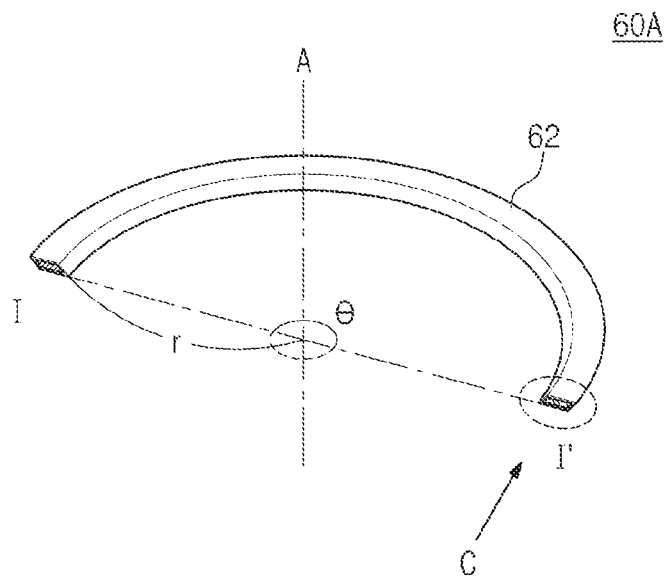
FIG. 3A is a perspective cross-sectional view taken along a line I-I according to FIG. 2.
Figure 3B:
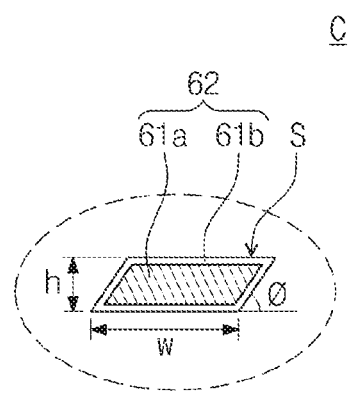
FIG. 3B is an enlarged cross-sectional view illustrating a portion I according to FIG. 3A
Figure 4:
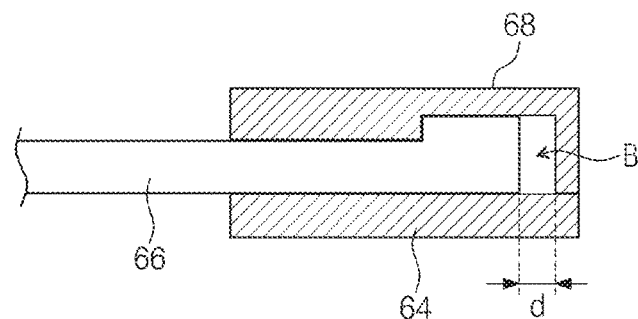
FIG. 4 is an enlarged cross-sectional view taken along a line II-II' of FIG. 2.

FIG. 2 is a perspective view illustrating a light controlling unit 60A according to an embodiment of the inventive concepts. FIG. 3A is a perspective cross-sectional view taken along a line I-I' of FIG. 2. FIG. 3B is an enlarged cross-sectional view illustrating a portion 'C' of FIG. 3A. FIG. 4 is an enlarged cross-sectional view taken along a line II-II' of FIG. 2. Referring to FIGS. 2, 3A, 3B, and 4, the light controlling unit 60A may include a blocking part 62, a base part 64, a supporting part 66, and a clamp part 68. The light controlling unit 60A may correspond to the light controlling unit 60 of FIG. 1. The blocking part 62 may block light. The blocking part 62 may have a ring shape when viewed from a plan view. Alternatively, the blocking part 62 may have an arc shape.

FIG. 3B provides a cross-sectional view of blocking part 62. The perimeter of blocking part 62 as shown in FIG. 3B includes a top surface opposite from a bottom surface and an inner sidewall opposite from an outer sidewall. The inner sidewall is the sidewall closest to the central axis A. In the depicted embodiment, the inner sidewall and the outer sidewall are essentially parallel, the top surface and the bottom surface are essentially parallel, the inner sidewall slopes downward from the top surface to the bottom surface toward the central axis A of the substrate W, the outer sidewall slopes upward from the bottom surface to the top surface away from the central axis A of the substrate W. In other words, the cross-sectional shape of the blocking part 62 may correspond to the shape of a parallelogram. The blocking part 62 may have various design parameters and may be variously modified. In some embodiments, the design parameters of the blocking part 62 may include a radius r, a central angle θ, a cross-sectional shape S, a width w of the cross section, a height h of the cross section, and a tilt angle Ø of the cross section. The parameters including the radius r, the central angle θ, the cross-sectional shape S, the width w of the cross section, the height h of the cross section, and the tilt angle Ø of the cross section of the blocking part 62 may not be limited to specific examples but may be variously changed. The radius r of the blocking part 62 is a parameter that may be adjusted to provide a desired position for a substrate W. The area defined by width w and height h can also be set as desired by adjusting width w and/or height h. In some embodiments, the cross-sectional shape S of the blocking part 62 may have one of various shapes such as a circular shape, a triangular shape, a quadrilateral shape, and a diamond shape. The blocking part 62 may be symmetrical and coaxially aligned with respect to the central axis A of the substrate W. Alternatively, the blocking part 62 may not be coaxial or may be asymmetrical with respect to the central axis A of the substrate W. In one embodiment, corners of the cross section of the blocking part 62 may be chamfered or rounded by a manufacturing process.

The blocking part 62 may include a core portion 61a and a coating layer 61b. The core portion 61a may include a metal material. For example, the core portion 61a may include at least one of stainless steel (SUS), aluminum (Al), and various alloys. Examples of suitable alloys include nickel-iron alloys such as Invar metals, austenite nickel-chromium-based superalloys such as Inconel alloys, and other superalloys or high-performance alloys such as the highly corrosion-resistant metal alloys sold by Haynes International, Inc. as HasteHoy® metals. The coating layer 61b may surround the core portion 61a. Light may not pass through the coating layer 61b but may be reflected by the coating layer 61b. The coating layer 61b may be formed of a material having an excellent reflection property with respect to light. For example, the coating layer 61b may include at least one of gold (Au) or silver (Ag). The coating layer 61b may increase a light reflectance of the blocking part 62 and may inhibit an increase in temperature of the core portion 61a. The core portion 61a may also be coated with nickel (Ni), chrome (Cr), or titanium (Ti) before the core portion 61a is coated with the coating layer 61b, and thus, may improve adhesive strength between the core portion 61a and the coating layer 61b.

The base part 64 may couple the blocking part 62 to the reflection housing 30. In addition, the base part 64 may also couple the blocking part 62 to the chamber 10. In one embodiment, the base part 64 may be coupled to the upper chamber 12. The supporting part 66 may connect the blocking part 62 to the base part 64. The configuration and size of the base part 64 may be variously changed depending on the shape of the blocking part 62. In one embodiment, the supporting part 66 may be provided in plurality along a circumferential direction of the blocking part 62 having a ring shape. The supporting part 66 may have a rod shape as illustrated in FIG. 2; however, embodiments of the inventive concepts are not limited thereto. The shapes of the supporting part 66 may be variously modified. One end of the supporting part 66 may be coupled to the blocking part 62, and another end of the supporting part 66 may be supported by the clamp part 68. The number of the clamp parts 68 may be equal to the number of the supporting parts 66, as depicted. The clamp part 68 may press the other end of the supporting part 66 to fix the supporting part 66. A buffer space B, as shown in FIG. 4, may be provided between the clamp part 68 and the other end of the supporting part 66. The buffer space B may be an empty space defined by the clamp part 68 and a portion of the supporting part 66 which are spaced apart from each other. Even though the light controlling unit 60A is thermally expanded by the thin film depositing process performed at a high temperature, the clamp part 68 may stably fix the blocking part 62 by the buffer space B. For example, the buffer space B may have a width d of about 0.1 mm to about 3 mm.

As shown in FIG. 1, the thin film deposition apparatus 1 may further include a lower reflection housing 70 and a lower light source unit 80. The lower reflection housing 70 may include a first lower reflection housing 72 and a second lower reflection housing 74. The lower light source unit 80 may be provided in the lower reflection housing 70. The lower reflection housing 70 may include the same material as the reflection housing 30 and may have the same or similar function as the reflection housing 30. The lower light source unit 80 may have the same or similar shape and function as the light source unit 40. In some embodiments, the lower reflection housing 70 and the lower light source unit 80 may be omitted. However, even though the thin film deposition apparatus 1 includes the lower reflection housing 70 and the lower light source unit 80, they may have significantly less influence on a substrate as compared with the light source unit 40, which is disposed above the substrate W, to influence the distribution of the light to substrate W. Thus, the lower reflection housing 70 and the lower light source unit 80 may have somewhat less impact on the function of the inventive concepts.

Figure 5:
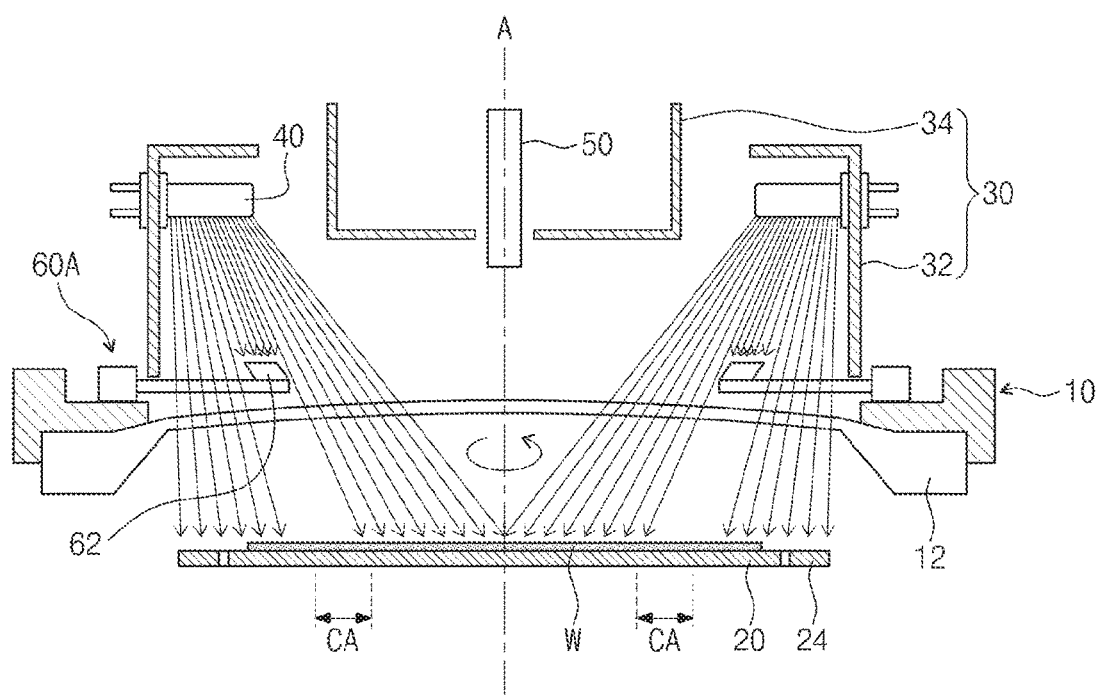
FIG. 5 is a schematic view illustrating a method of blocking light using the light controlling unit of FIGS. 3 to 4.
Figure 6:
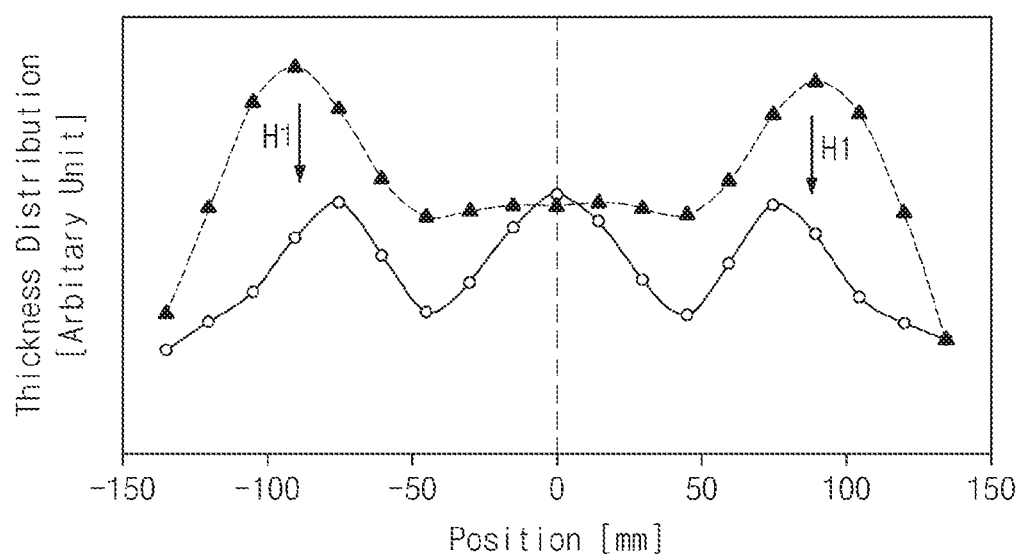
FIG. 6 is a graph illustrating experimental data showing a thickness distribution of a thin film depending on a position of a substrate when the light controlling unit of FIG. 2 is used.

FIG. 5 is a schematic view illustrating a method of blocking light using the light controlling unit 60A of FIGS. 2 to 5. FIG. 6 is a graph illustrating experimental data showing a thickness distribution of a thin film depending on a position of a substrate W when the light controlling unit 60A of FIG. 2 is used. The light controlling unit 60A may block light irradiated toward a control area CA of the substrate W. The light controlling unit may directly block at least a portion of an irradiation path of the light to control a light irradiation area of the substrate W. Since the blocking part 62 of the light controlling unit 60A directly blocks at least a portion of the irradiation path of the light, it is possible to reduce a deviation of the irradiation amount of the light depending on a position of the substrate W. Since at least a portion of the light is blocked by the blocking part 62 of the light controlling unit 60A, a shadow effect may occur on the control region CA of the substrate W. Thus, light energy may be shielded to adjust a growth rate of silicon on the control area CA. Even though not shown in the drawings, at least a portion of light reflected in the reflection housing and/or at least a portion of light irradiated from the lower source units 40 may be irradiated to the control area CA.

Referring to FIG. 6, a full line shows a thickness distribution of a thin film formed using the light controlling unit 60A, and a dotted line shows a thickness distribution of a thin film formed not using the light controlling unit 60A. FIG. 6 shows the thickness distributions of the thin films according to a position of the substrate W wherein a unit of the thickness distribution may be an arbitrary unit. As illustrated in FIG. 6, due to the light controlling unit 60A, the thickness of the thin film is reduced by a difference H1 in an area, such as a control area CA, which is spaced apart from a center of the substrate W. A distance between the center of the substrate W and a center of the control area CA may be about 100 mm. For example, in the control area CA, the thickness of the thin film may be reduced by the difference H1 of about 110 Å to about 140 Å. A reduction value of luminous intensity may be varied as at least one of the parameters of the ring-shaped blocking part 62 is varied, including the radius r, the central angle θ, cross-sectional shape S, the width w of the cross section, the height h of the cross section, and the tilt angle Ø of the cross section. In this case, a thickness distribution shape and an effect may be similar to those illustrated in FIG. 6. In other words, since the luminous intensity of light provided into the inner space 11 of the chamber 10 is changed, a temperature of the substrate W may be uniformly controlled to grow a uniform epitaxial layer on the entire area of the substrate W.

Figure 7:
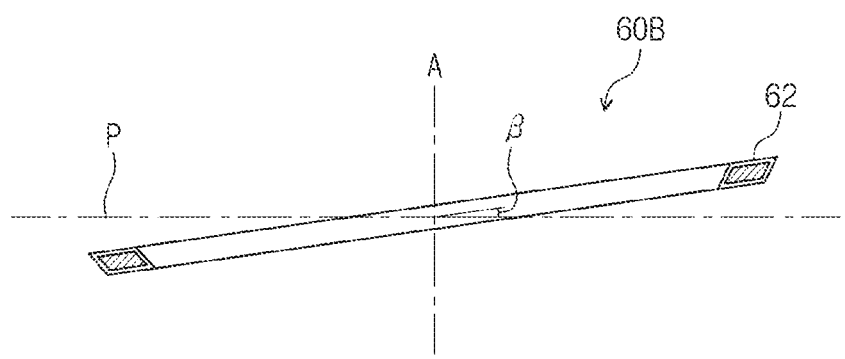
FIG. 7 is a schematic view illustrating a light controlling unit according to an embodiment of the inventive concepts.

FIG. 7 is a schematic view illustrating a light controlling unit 60B according to an embodiment of the inventive concepts. A shape and a function of the light controlling unit 60B of FIG. 7 may be substantially the same or similar to the shape and the function of the light controlling unit 60A of FIG. 2. However, a blocking part 62 of the light controlling unit 60B of FIG. 7 may be tilted. In other words, the blocking part 62 may have a tilt angle β with respect to a plane P perpendicular to the central axis A of the substrate W. In FIG. 7, the angle β is exaggerated for clarity. Alternatively, the angle β may be a smaller angle such as only several degrees, about one degree, or less than about one degree. In the case in which the blocking part 62 has the angle β, the blocking part 62 may obtain an effect similar to an effect obtained by a blocking part having different height and width from the blocking part 62.

Figure 8:
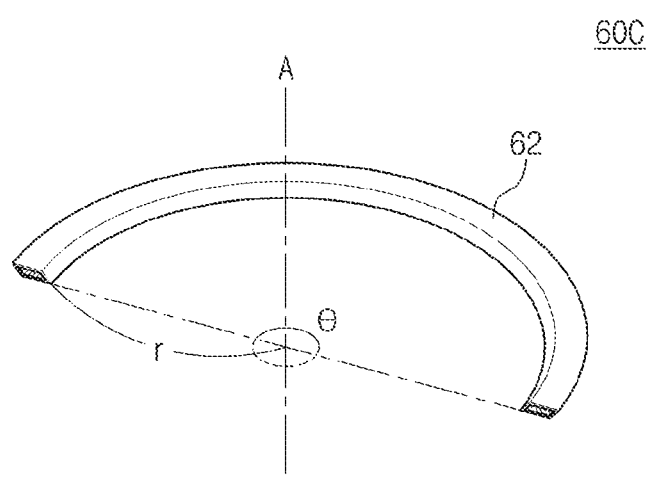
FIG. 8 is a schematic view illustrating a light controlling unit according to an embodiment of the inventive concepts.
Figure 9:
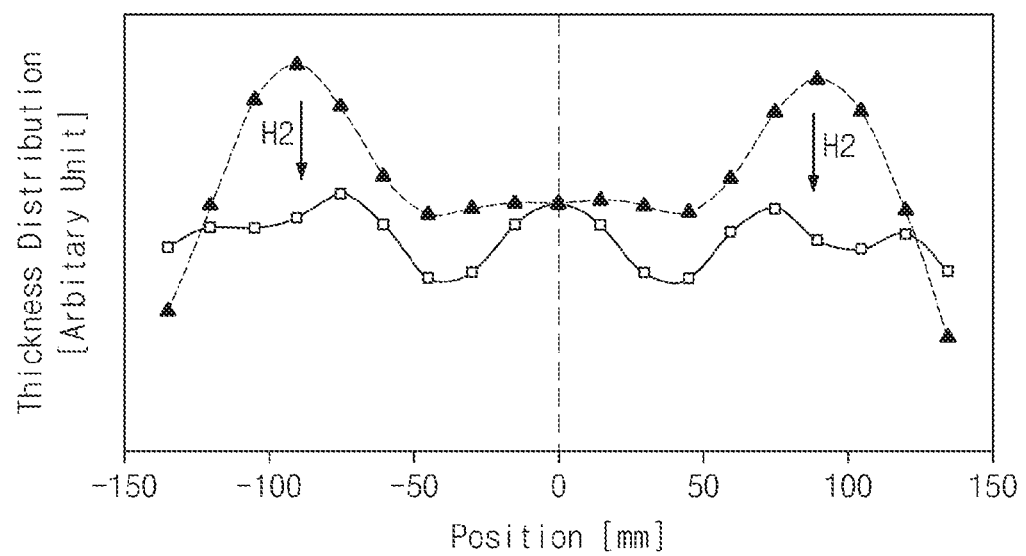
FIG. 9 is a graph illustrating experimental data showing a thickness distribution of a thin film depending on a position of a substrate when the light controlling unit of FIG. 8 is used.

FIG. 8 is a schematic view illustrating a light controlling unit 60C according to an embodiment of the inventive concepts. FIG. 9 is a graph illustrating experimental data showing a thickness distribution of a thin film depending on a position of a substrate W when the light controlling unit 60C of FIG. 8 is used. The light controlling unit 60C may have an arc-shaped blocking part 62. The arc-shaped blocking part 62 may be provided in the reflection housing 30 so as to be adjacent to one inner sidewall of the reflection housing 30. Since the thin film deposition process is performed while rotating the substrate W by the susceptor 20, the distribution of the substrate W may be symmetrical with respect to the central axis A of the substrate W. FIG. 9 illustrates a graph showing results of a thin film distribution experiment using the blocking part 62 having a central angle θ of 180 degrees.

Referring to FIG. 9, the thickness distributions of the thin films are shown according to a position of the substrate W. In FIG. 9, a full line shows a thickness distribution of a thin film formed using the light controlling unit 60C, and a dotted line shows a thickness distribution of a thin film formed not using the light controlling unit 60C. The unit of the thickness distribution depicted in FIG. 9 may be an arbitrary unit. As illustrated in FIG. 9, due to the light controlling unit 60C, the thickness of the thin film is reduced by a difference H2 in an area, such as the control area CA, that is spaced apart from a center of the substrate W. The distance between the center of the substrate W and a center of the control area CA may be about 100 mm. For example, in the control area CA, the thickness of the thin film may be reduced by the difference H2 of about 80 Å to about 100 Å. A reduction value of luminous intensity may be varied as at least one of the parameters of the arc-shaped blocking part 62 is varied including the radius r, the central angle θ, the cross-sectional shape S, the width w of the cross section, the height h of the cross section, and the tilt angle Ø of the cross section. In this case, a thickness distribution shape and an effect may be similar to those illustrated in FIG. 9.

Figure 10:
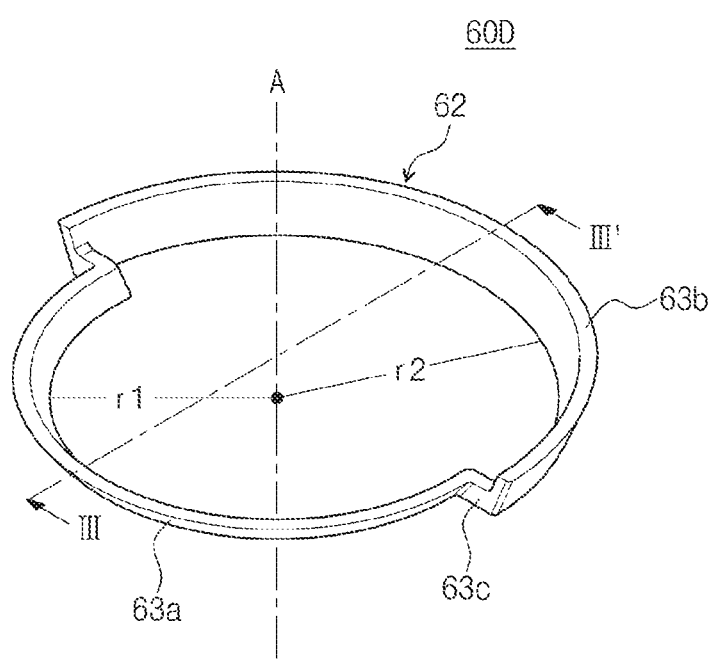
FIG. 10 is a perspective view illustrating a blocking part of a light controlling unit according to an embodiment of the inventive concepts.
Figure 11:
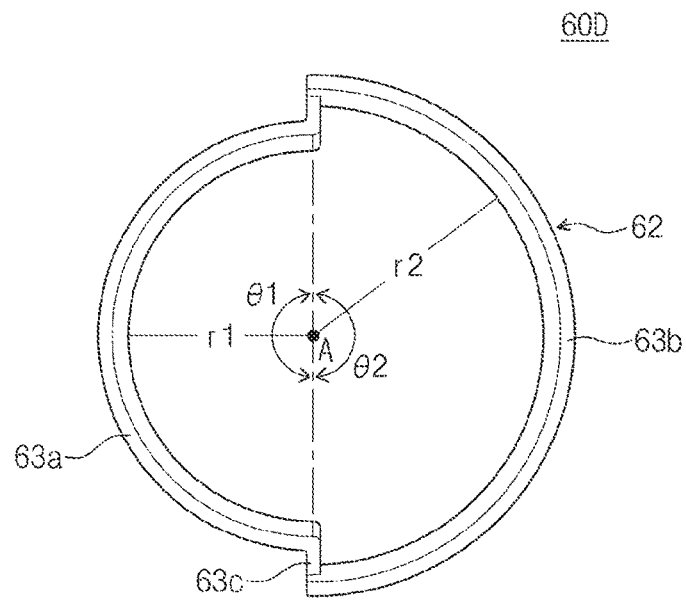
FIG. 11 is a top view illustrating the blocking part of FIG. 10.
Figure 12:
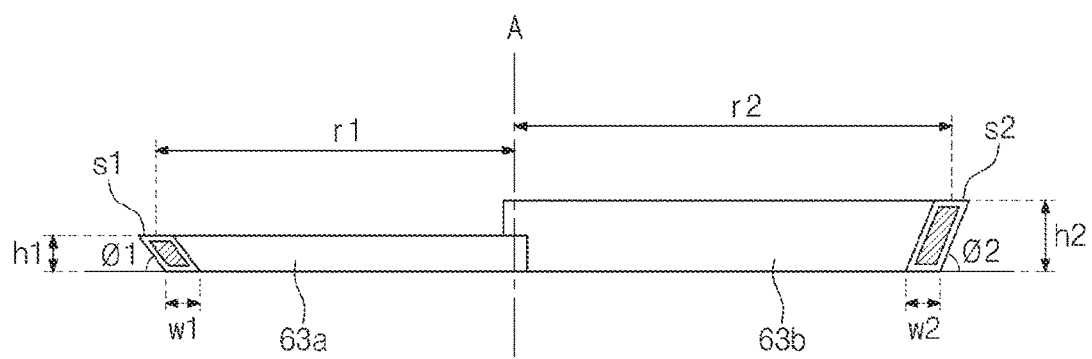
FIG. 12 is an enlarged cross-sectional view taken along a line of FIG. 10.

FIG. 10 is a perspective view illustrating a blocking part 62 of a light controlling unit 60D according to an embodiment of the inventive concepts. FIG. 11 is a top view illustrating the blocking part 62 of FIG. 10. FIG. 12 is an enlarged cross-sectional view taken along a line of FIG. 10. The blocking part 62 may include a plurality of bodies. In the embodiment illustrated in FIGS. 10 to 12, the blocking part 62 may include a first body 63a, a second body 63b, and a connection portion 63c. Each of the first and second bodies 63a and 63b may include an arc shape. The first body 63a and the second body 63b may be coupled to each other to constitute a substantially ring-shaped configuration when viewed from a plan view. At least one of a radius of curvature, a central angle, a cross-sectional shape, a width of the cross section, a height of the cross section, or a tilt angle of the cross section of the first body 63a may be different from that or those of the second body 63b. In this case, the connection portion 63c may connect the first body 63a to the second body 63b.

Referring to FIGS. 10 to 12, the first body 63a may have a first radius r1, a first central angle θ1, a first shape s1, a first width w1, a first height h1, and a first tilt angle Ø1. The second body 63b may have a second radius r2, a second central angle θ2, a second shape s2, a second width w2, a second height h2, and a second tilt angle Ø2. The second radius r2 may be greater than the first radius r1. The difference between the first and second radiuses r1 and r2 may range from about 2 mm to 50 mm. The first radius r1 of the first body 63a may also be smaller than a radius of an embodiment with one body having a ring shape. Similarly, the second radius r2 of the second body 63b may be greater than the radius of an embodiment with one body having a ring shape. Each of the first and second shapes s1 and s2 may have a parallelogram shape with an inner sidewall sloping downward from a top surface to a bottom surface of the body toward the central axis A and outer sidewall sloping upward from the bottom surface to the top surface. The tilt angles Ø1 and Ø2 may be varied depending on the radiuses r1 and r2. For example, since main incident angles of different areas of the substrate W are different from each other, the tilt angle Ø may be varied depending on the radius r of the blocking part 62. The central angles θ1 and θ2 of the first and second bodies 63a and 63b may be combined with each other to constitute 360 degrees. Each of the central angles θ1 and θ2 of the first and second bodies 63a and 63b may be 180 degrees. The second width w2, the second height h2, and the second tilt angle Ø2 may be greater than the first width w1, the first height h1, and the first tilt angle Ø1, respectively. Alternatively, the radiuses r1 and r2, the central angles θ1 and θ2, the widths w1 and w2, the heights h1 and h2, and the tilt angles Ø1 and Ø2 of the first and second bodies 63a and 63b may be modified in various forms. In addition, when the blocking part 62 includes a plurality of bodies, the number of the bodies included in the blocking part 62 may be three or more.

Figure 13:
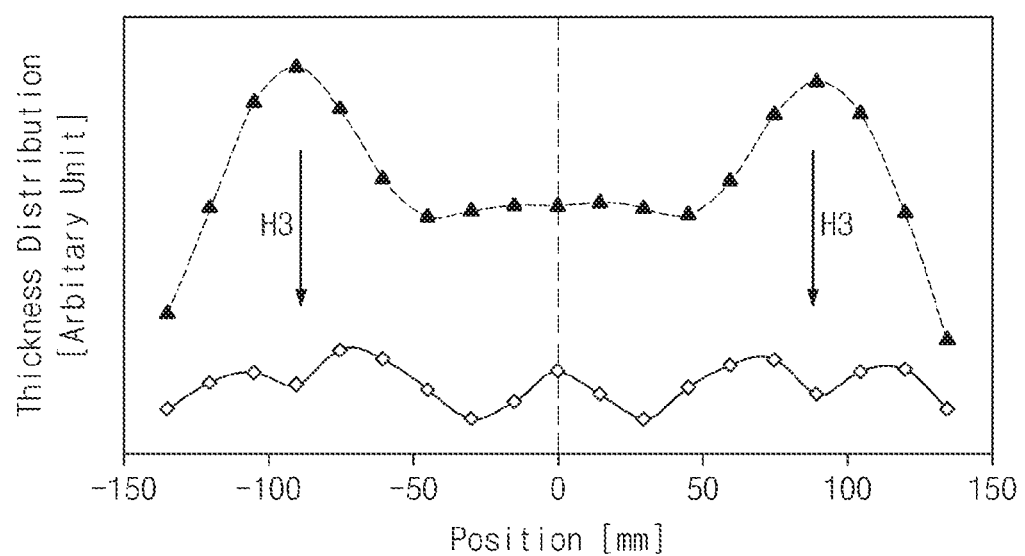
FIG. 13 is a graph illustrating experimental data showing a thickness distribution of a thin film depending on a position of a substrate when the light controlling unit of FIG. 10 is used.

FIG. 13 is a graph illustrating experimental data showing a thickness distribution of a thin film depending on a position of a substrate W when the light controlling unit 60D of FIG. 10 is used. In FIG. 13, a full line shows a thickness distribution of a thin film formed using the light controlling unit 60D, and a dotted line shows a thickness distribution of a thin film formed not using the light controlling unit 60D. The unit of the thickness distribution depicted in FIG. 13 may be an arbitrary unit. As illustrated in FIG. 13, due to the light controlling unit 60D, the thickness of the thin film is reduced by a difference H3 in the area, such as the control area CA, that is spaced apart from a center of the substrate W. The distance between the center of the substrate W and the center of the control area CA may be about 100 mm. For example, in the control area CA, the thickness of the thin film may be reduced by the difference H3 of about 180 Å to about 230 Å. Note that H3 is greater than the reductions identified as H2 and H1 respectively in FIG. 9 and FIG. 6. A reduction value of luminous intensity may be varied as the parameters of the first and second bodies 63a and 63b are varied including the radiuses r1 and r2, the central angles θ1 and θ2, the cross-sectional shapes s1 and s2, the widths w1 and w2 of the cross sections, the heights h1 and h2 of the cross sections, and/or the tilt angles Ø1 and Ø2 of the cross sections. Variation of these parameters may be optimized to achieve a thickness distribution shape and an effect similar to those illustrated in FIG. 13.

The blocking part 62 depicted in FIGS. 10 to 12 includes bodies 63a and 63b, which are non-continuously connected to each other. Alternatively, the bodies 63a and 63b of the blocking part 62 may be continuously connected to each other. In other words, at least one of the radius of curvature, the cross-sectional shape, the width of the cross section, the height of the cross section, or the tilt angle of the cross section of the blocking part 62 may be continuously varied.

Figure 14:
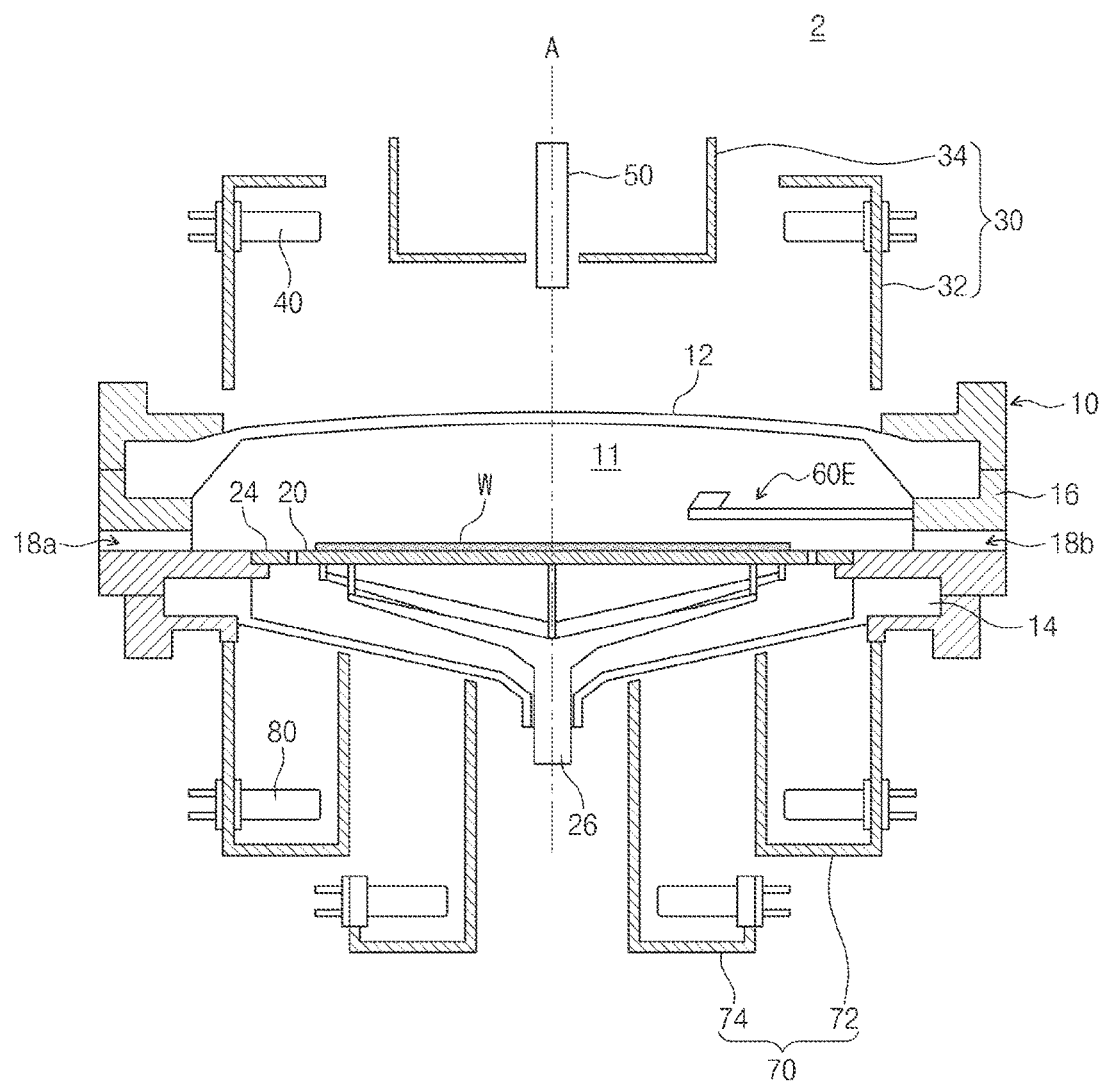
FIG. 14 is a schematic view illustrating an apparatus for depositing a thin film in accordance with an embodiment of the inventive concepts.
Figure 15:
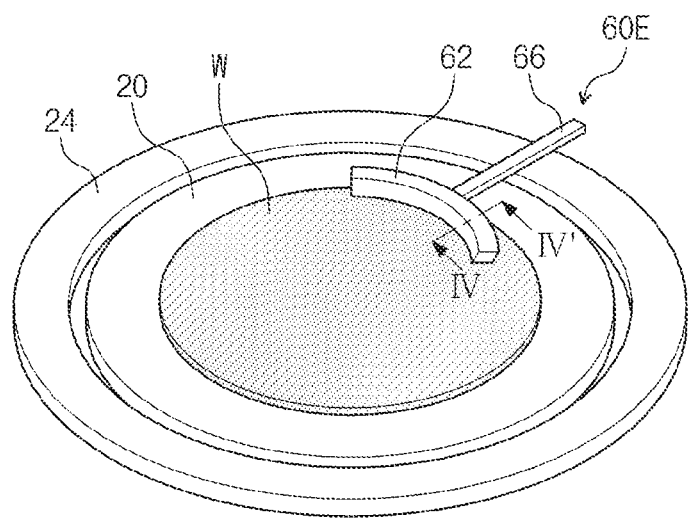
FIG. 15 is a perspective view illustrating a portion of the apparatus of FIG. 14.
Figure 16:
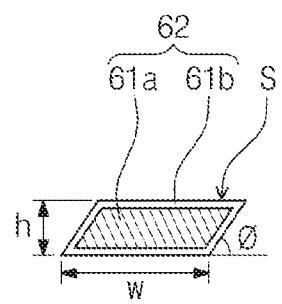
FIG. 16 is a cross-sectional view taken along a line IV-IV of FIG. 15.
Figure 17:
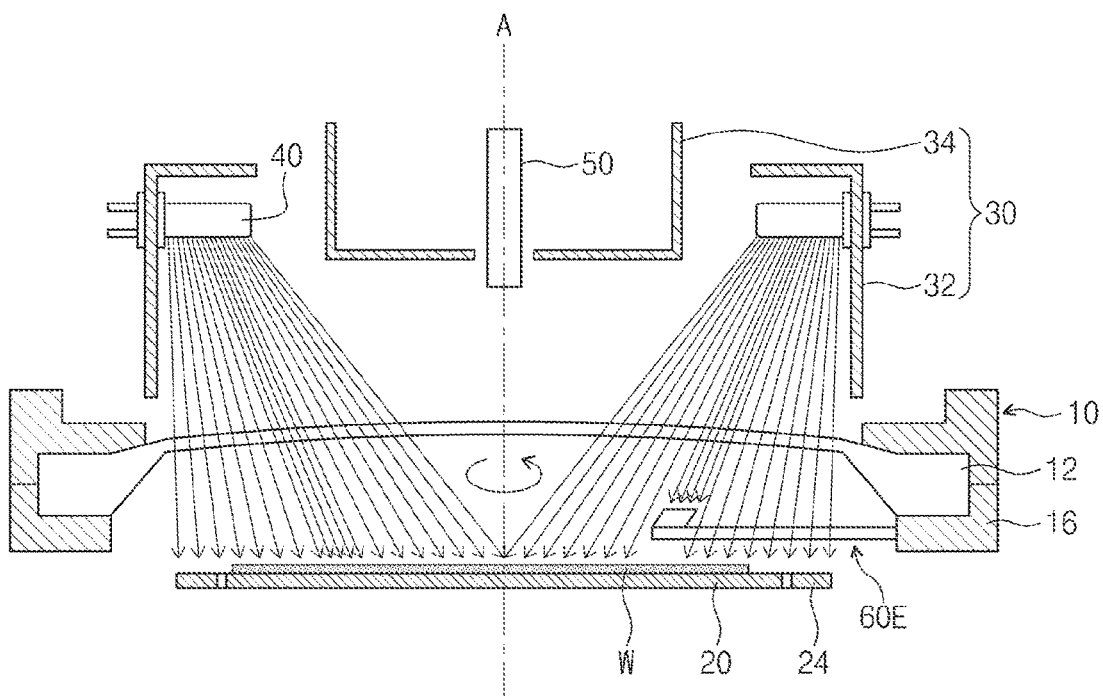
FIG. 17 is a schematic view illustrating a method of irradiating light using a light controlling unit of FIG. 14.

FIG. 14 is a schematic view illustrating an apparatus 2 for depositing a thin film in accordance with an embodiment of the inventive concepts. FIG. 15 is a perspective view illustrating a portion of the apparatus 2 of FIG. 14. FIG. 16 is a cross-sectional view taken along a line IV-IV' of FIG. 15. FIG. 17 is a schematic view illustrating a method of irradiating light using a light controlling unit 60E of FIG. 14. In the present embodiment, the same elements that correspond with identical or similar elements of the apparatus 1 of FIG. 1 are indicated by the same reference numerals or the same reference designators. For the purpose of ease and convenience in explanation, the descriptions to the same elements as in the embodiment of FIG. 1 is omitted or mentioned briefly.

Referring to FIGS. 14 to 17, the light controlling unit 60E may be provided in the inner space 11 of the chamber 10. A blocking part 62 of the light controlling unit 60E may have an arc shape. The light controlling unit 60E may be provided to be adjacent to the gas exhaust part 18b. Thus, it is possible to reduce an influence of the light controlling unit 60E on a flow of the process gas. Even though the light controlling unit 60E is provided in a region of the inner space 11, the substrate W may be rotated by the susceptor 20 during the thin film deposition process. Thus, the thin film on the substrate W may be substantially symmetrical with respect to the central axis A of the substrate W.

As shown in FIG. 16, the blocking part 62 may include a core portion 61a and a coating layer 61b. The core portion 61a may include a ceramic material. For example, the core portion 61a may include at least one of silicon carbide, aluminum oxide, or graphite. The coating layer 61b may surround the core portion 61a. The coating layer 61b may be formed of a material having an excellent etch resistance with respect to an acidic or basic gas. The etch resistance of the coating layer 61b may be higher than that of the core portion 61a. In one embodiment, the coating layer 61b may be formed of a material having an excellent etch resistance with respect to hydrogen chloride (HCl). For example, the coating layer 61b may include at least one of silicon (Si), silicon oxide ($SiO_2$), or silicon carbide (SiC).

The thin film deposition apparatus according to the inventive concepts may control the thickness distribution of a specific area of the substrate W to improve uniformity of the thin film on the entire area of the substrate W. In the above embodiments, the control area CA may be disposed, for example, at about 100 mm from the center of the 300 mm substrate. However, embodiments of the inventive concepts are not limited to a size of the substrate W and/or a position of the specific area in the substrate W.

The thin film deposition apparatus according to embodiments of the inventive concepts may be applied to other apparatuses such as electron cyclotron resonance (ECR) plasma chemical vapor deposition (CVD) apparatuses, and inductively coupled RF high-density plasma CVD apparatuses. In addition, in the above mentioned embodiments, the thin film deposition apparatus performing a CVD process is described as an example. However, embodiments of the inventive concepts are not limited thereto. The apparatus according to embodiments of the inventive concepts may be applied to plasma etching apparatuses or physical vapor deposition (PVD) apparatuses. Moreover, in the above mentioned embodiments, the process of forming the epitaxial layer is described as an example. Alternatively, the apparatus according to embodiments of the inventive concepts may be applied to a process of forming a poly-crystalline layer or an amorphous layer. Furthermore, in the above mentioned embodiments, the thin film depositing process performed at the high temperature is described as an example. Alternatively, the apparatus according to embodiments of the inventive concepts may be applied to other various processes using irradiated light.

As described above, the thin film deposition apparatus may block at least a portion of the light irradiated to the substrate by means of the light controlling unit, thereby controlling the formation of the thin film by the shadow effect. As a result, it is possible to resolve a non-uniform problem of the thickness of the thin film formed on the substrate. Stated otherwise, the apparatus may control the light irradiation amount to adjust the temperature of the substrate, and thus, the uniform thin film may be formed on the substrate.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

Any methods disclosed herein comprise one or more steps or actions for performing the described method. The method steps and/or actions may be interchanged with one another. In other words, unless a specific order of steps or actions is required for proper operation of the embodiment, the order and/or use of specific steps and/or actions may be modified.

References to approximations are made throughout this specification, such as by use of the terms "about" or "approximately." For each such reference, it is to be understood that, in some embodiments, the value, feature, or characteristic may be specified without approximation. For example, where qualifiers such as "about," "substantially," and "generally" are used, these terms include within their scope the qualified words in the absence of their qualifiers.

Reference throughout this specification to "an embodiment" or "the embodiment" means that a particular feature, structure or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the preceding claims up to and including claim [x]," where the bracketed term "[x]" is replaced with the number of the most recently recited independent claim. For example, for the first claim set that begins with independent claim 1, claim 3 may depend from either of claims 1 and 2, with these separate dependencies yielding two distinct embodiments; claim 4 may depend from any one of claim 1, 2, or 3, with these separate dependencies yielding three distinct embodiments; claim 5 may depend from any one of claim 1, 2, 3, or 4, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed in accordance with 35 U.S.C. § 112¶16. Embodiments of the invention in which an exclusive property or privilege is claimed are defined as follows.

What is claimed is:

1. An apparatus for depositing a thin film, the apparatus comprising:
a chamber;
a susceptor disposed in the chamber, the susceptor is configured to support a substrate;
a reflection housing disposed outside the chamber;
a light source unit disposed in the reflection housing, the light source unit irradiating light to the susceptor; and
a light controlling unit blocking at least a portion of an irradiation path of the light to control an irradiation area of the light on the susceptor,
wherein at least a portion of the light controlling unit is disposed between the light source, unit and the susceptor, and
wherein the light controlling unit comprises:
a blocking part blocking the at least a portion of the irradiation path of the light so that a portion of the light is prevented from arriving at the susceptor;
a base part attached fixedly to the chamber;
a supporting part connecting the blocking part to the base part; and wherein the light controlling unit is disposed in the reflection housing.

2. The apparatus of claim 1,
wherein the blocking part comprises:
a core portion; and
a coating layer surrounding the core portion.

3. The apparatus of claim 2,
wherein the core portion includes a metal material, and
wherein the coating layer is a reflection layer.

4. The apparatus of claim 1,
wherein the blocking part has a ring shape when viewed from a plan view, and
wherein the blocking part is coaxially aligned with respect to a central axis of the susceptor.

5. The apparatus of claim 4,
wherein the blocking part comprises:
a first body and a second body coupled to each other to constitute the ring shape,
wherein each of the first and second bodies has an arc shape, and
wherein at least one of a radius of curvature, a central angle, a shape of a cross section, a width of the cross section, a height of the cross section or a tilt angle of the cross section of the first body is different from that or those of the second body.

6. The apparatus of claim 1,
wherein the blocking part has a cross-sectional shape that corresponds with a parallelogram.

7. The apparatus of claim 1,
wherein the blocking part is tilted with respect to a plane perpendicular to a central axis of the susceptor.

8. The apparatus of claim 1, wherein the blocking part has an arc shape.

9. The apparatus of claim 1,
wherein the light controlling unit further comprises:
a clamp part fixing the supporting part to the base part,
wherein a buffer space is provided between the clamp part and the supporting part.

10. An apparatus for depositing a thin film, the apparatus comprising:
a chamber;
a susceptor disposed in the chamber, the susceptor is configured to support a substrate; a reflection housing disposed outside the chamber;
a light source unit disposed above the susceptor, the light source unit irradiating light toward the susceptor; and
a light controlling unit disposed between the light source unit and the susceptor to control an irradiation area of the light directed to the susceptor,
a preheating ring configured to preheat the process gas to a predetermined temperature so as to pyrolyze the process gas;
a gas injection part injecting a process gas for depositing a thin film on the substrate into the chamber;

a gas exhaust part disposed to the opposite to the gas injection part respective to the susceptor, the gas exhaust part exhausting the process gas, and wherein the light controlling unit is disposed in the reflection housing.

11. The apparatus of claim 10,
wherein the light controlling unit comprises:
a core portion blocking the light; and
a coating layer surrounding the core portion,
wherein the core portion includes a ceramic material, and
wherein a coating layer includes a material having a higher etch resistance than that of the core portion.

12. The apparatus of claim 11, wherein the core portion has an arc shape.

13. The apparatus of claim 11, wherein the core portion includes a metal material, and
wherein the coating layer includes at least one of gold or silver.

* * * * *